United States Patent
Li et al.

(10) Patent No.: US 10,083,984 B2
(45) Date of Patent: Sep. 25, 2018

(54) INTEGRATED STRUCTURES AND METHODS OF FORMING INTEGRATED STRUCTURES

(71) Applicant: Micron Technology, Inc., Boise, ID (US)

(72) Inventors: Jie Li, Boise, ID (US); James Mathew, Boise, ID (US); Kunal Shrotri, Boise, ID (US); Luan C. Tran, Meridian, ID (US); Gordon A. Haller, Boise, ID (US); Yangda Zhang, Singapore (SG); Hongpeng Yu, Singapore (SG); Minsoo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/679,727

(22) Filed: Aug. 17, 2017

(65) Prior Publication Data
US 2017/0365617 A1  Dec. 21, 2017

Related U.S. Application Data

(62) Division of application No. 15/187,632, filed on Jun. 20, 2016, now Pat. No. 9,773,805.

(51) Int. Cl.
| | |
|---|---|
| *H01L 29/76* | (2006.01) |
| *H01L 27/11582* | (2017.01) |
| *H01L 27/11556* | (2017.01) |
| *H01L 27/11524* | (2017.01) |
| *H01L 27/1157* | (2017.01) |

(52) U.S. Cl.
CPC .... *H01L 27/11582* (2013.01); *H01L 27/1157* (2013.01); *H01L 27/11524* (2013.01); *H01L 27/11556* (2013.01); *H05K 999/99* (2013.01)

(58) Field of Classification Search
CPC ......... H01L 27/11582; H01L 27/11556; H01L 29/51; H01L 29/518
See application file for complete search history.

(56) References Cited

U.S. PATENT DOCUMENTS

| | | | |
|---|---|---|---|
| 8,946,808 B2 * | 2/2015 | Lee | H01L 29/66833 257/314 |
| 2011/0031550 A1 * | 2/2011 | Komori | H01L 27/11573 257/324 |

(Continued)

*Primary Examiner* — Mark Tornow
(74) *Attorney, Agent, or Firm* — Wells St. John P.S.

(57) ABSTRACT

Some embodiments include an integrated structure having a first opening extending through a stack of alternating insulative levels and conductive levels. A nitride structure is within the first opening and narrows the first opening to form a second opening. Detectable oxide is between the nitride structure and one or more of the conductive levels. Some embodiments include an integrated structure having a conductive material, a select device gate material over the conductive material, and vertically-stacked conductive levels over the select device gate material. A first opening extends through the vertically-stacked levels to the conductive material and has opposing sidewalls along a cross-section. Nitride liners are along the sidewalls of the first opening. Detectable oxide is between at least one of the nitride liners and one or more of the vertically-stacked conductive levels. Some embodiments include methods for forming integrated structures.

6 Claims, 6 Drawing Sheets

(56) References Cited

U.S. PATENT DOCUMENTS

| | | | | |
|---|---|---|---|---|
| 2014/0239303 A1* | 8/2014 | Zhu | .................. | H01L 27/115 |
| | | | | 257/66 |
| 2014/0252363 A1* | 9/2014 | Liu | .................. | H01L 27/11556 |
| | | | | 257/66 |
| 2015/0333186 A1* | 11/2015 | Yoo | .................. | H01L 21/28282 |
| | | | | 257/324 |
| 2016/0225786 A1* | 8/2016 | Lee | .................. | H01L 27/11582 |

* cited by examiner

INTEGRATED STRUCTURES AND METHODS OF FORMING INTEGRATED STRUCTURES

RELATED PATENT DATA

This patent resulted from a divisional of U.S. patent application Ser. No. 15/187,632, which was filed Jun. 20, 2016, and which is hereby incorporated herein by reference.

TECHNICAL FIELD

Integrated structures and methods of forming integrated structures.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured to comprise vertically-stacked memory cells. It is desired to develop improved NAND architecture, and improved methods of forming NAND architecture.

While some of the embodiments described below were motivated by a desire to improve NAND architecture, the improvements may have application beyond NAND architectures.

DETAILED DESCRIPTION OF THE ILLUSTRATED EMBODIMENTS

Some embodiments pertain to processing utilized to form slits which subdivide a memory structure into blocks. The slits extend through a plurality of stacked conductive levels and down to a conductive source line. Nitride barrier material is formed to line the slits. However, it is found that conductive stringers may be generated during the formation of the slits and undesirably short two or more of the stacked conductive levels to one another. Accordingly, an oxidative treatment is incorporated into the fabrication process. The oxidative treatment converts the conductive stringers into insulative structures to thereby remove the conductive stringers as a source for undesired shorting. The nitride barrier material is then formed after the oxidative treatment. Some embodiments include structures comprising detectable oxide (e.g., oxide formed during the oxidative treatment) between a nitride structure (e.g., the nitride barrier material) and a conductive level.

Example embodiments are described below with reference to FIGS. 1-11.

Figure 1:
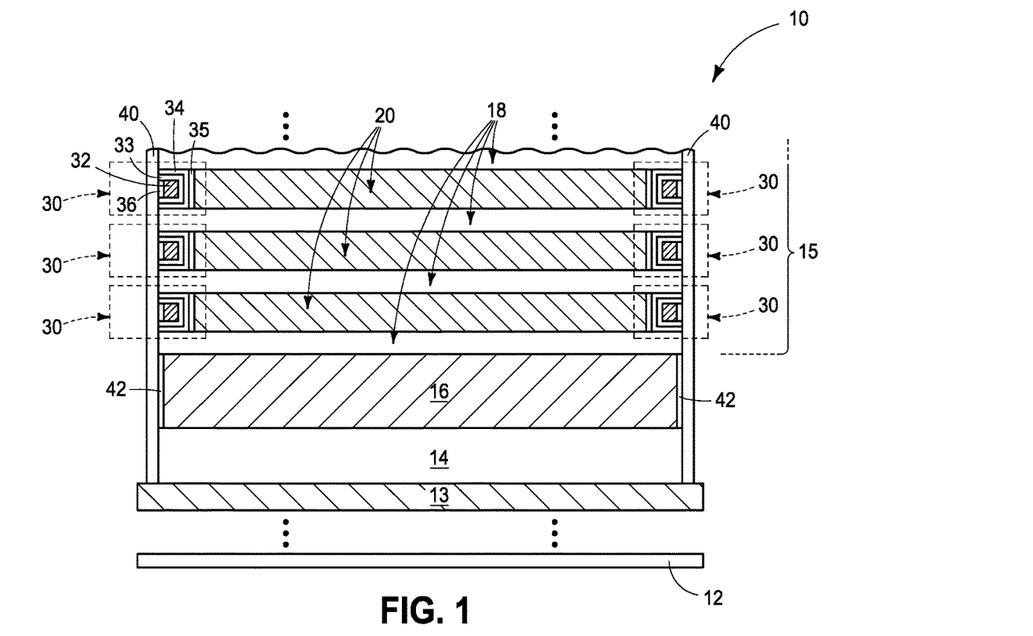
FIGS. 1 and 2 are diagrammatic cross-sectional views of an integrated assembly, with FIG. 2 showing memory cells of the assembly more generically than FIG. 1.

Referring to FIG. 1, a semiconductor construction 10 is shown to comprise a stack 15 of alternating first and second levels 18 and 20. The levels 18 are insulative and the levels 20 are conductive. The conductive levels 20 may comprise, for example, one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, the conductive levels 20 may comprise n-type doped polycrystalline silicon (i.e., n-type doped polysilicon). The insulative levels 18 may comprise any suitable composition or combination of compositions; and may, for example, comprise oxide (e.g., silicon dioxide).

The levels 18 and 20 may be of any suitable thicknesses; and may, for example, have thicknesses within a range of from about 10 nm to about 300 nm. In some applications, the levels 18 may be thinner than the levels 20. For instance, levels 18 may be about 20 nm thick and levels 20 may be about 30 nm thick.

The conductive levels 20 may include wordlines and control gates of flash devices. The stack 15 may comprise any suitable number of conductive levels. For instance, the stack may have 8 conductive levels, 16 conductive levels, 32 conductive levels, 64 conductive levels, etc.

The stack is over a select gate material 16, which is over an insulative material 14, which in turn is over a conductive source material 13.

In some embodiments the select gate material 16 may be source-side select gate material (SGS material). The SGS material 16 may comprise any suitable electrically conductive composition or combination of compositions; and may, for example, comprise p-type doped silicon and/or other suitable conductively-doped semiconductor material.

The insulative material 14 may comprise, for example, one or more oxides; such as, for example, one or more of aluminum oxide, hafnium oxide, etc.

The source material 13 may comprise any suitable conductive material; and may, for example, comprise metal (e.g., copper, titanium, tungsten, etc.), metal-containing composition(s) (e.g., metal carbide, metal nitride, metal silicide, etc.) and/or conductively-doped semiconductor material (e.g., conductively-doped silicon, conductively-doped germanium, etc.).

The conductive source material 13 is supported by a base 12. A break is provided between the conductive source material 13 and the base 12 to indicate that there may be additional materials and/or integrated circuit structures between the base and the conductive source material 13.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the base 12 may correspond to a semiconductor substrate containing one or more materials associated with integrated circuit fabrication. Such materials may include, for example, one or more of refractory metal materials, barrier materials, diffusion materials, insulator materials, etc.

In some embodiments the conductive material 13, insulative material 14, SGS material 16 and stack 15 may be considered to comprise an assembly formed over the substrate 12.

Memory cells 30 are along the conductive levels 20. In some embodiments, the conductive levels 20 may be considered to be vertically stacked, and similarly the memory cells 30 may be considered to be vertically stacked.

The illustrated memory cells include charge-storage structures 32, charge-blocking dielectric materials 33-35, and gate dielectric 36.

The charge-storage structures 32 may comprise, for example, floating gate material (for instance, doped or undoped silicon) or charge-trapping material (for instance, silicon nitride, metal dots, etc.).

The blocking dielectric materials 33-35 may comprise, for example, materials selected from silicon dioxide, silicon nitride, hafnium oxide, zirconium oxide, etc. For instance, in some embodiments material 34 is silicon nitride, and materials 33 and 35 are oxides (e.g., silicon dioxide, hafnium oxide, zirconium oxide, etc.).

Gate dielectric 36 may comprise any suitable material (e.g., silicon dioxide).

Channel material 40 extends along stack 15, along the SGS material 16, and down to the conductive source material 13. The channel material may comprise any suitable composition or combination of compositions; and in some embodiments may comprise silicon (e.g., polycrystalline silicon).

Dielectric material 42 isolates SGS material 16 from the channel material 40. The dielectric material 42 may comprise any suitable composition (e.g., silicon dioxide).

The memory cells 30 include regions of the channel material 40 adjacent the charge-storage structures 32.

Figure 2:
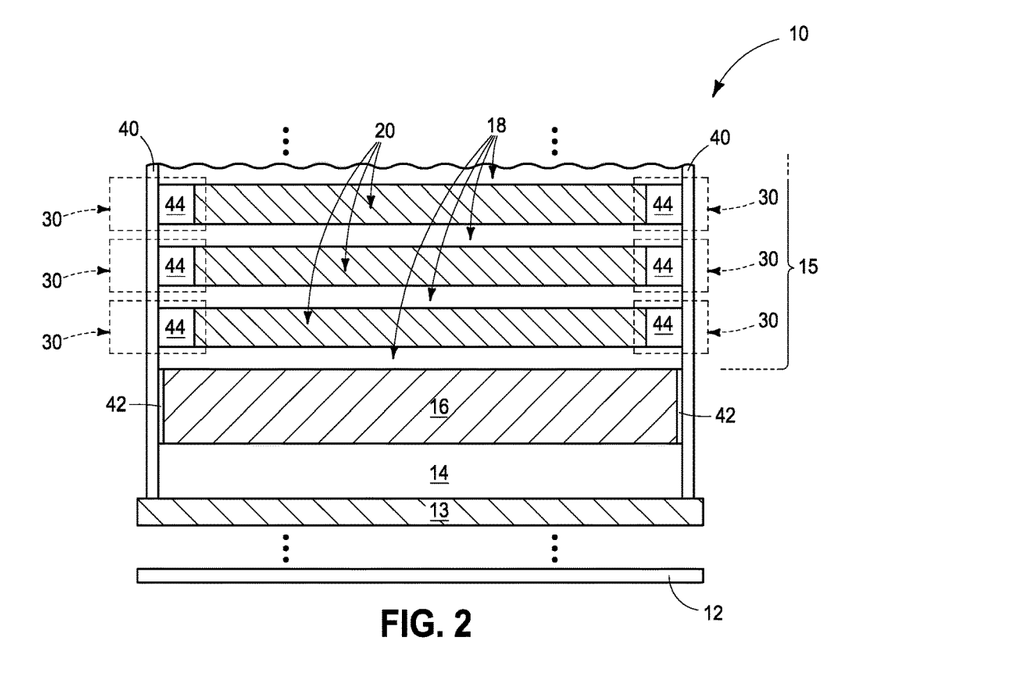

The illustrated memory cells are example NAND memory cell configurations. In other embodiments, other NAND memory cell configurations may be utilized. FIG. 2 shows construction 10, but more generically illustrates the memory cells 30. Specifically, boxes 44 are provided to generically indicate regions where charge-blocking material and charge-trapping material may be provided within the memory cells in any suitable configuration.

Figure 3:
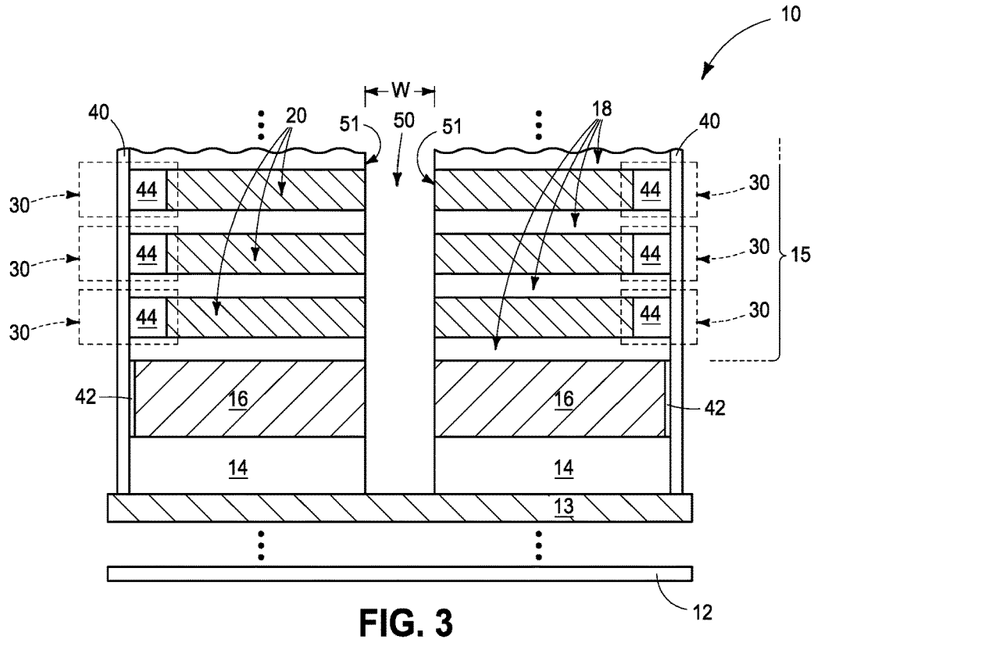
FIGS. 3 and 4 are diagrammatic cross-sectional views of the integrated assembly of FIG. 2 shown at processing stages following that of FIG. 2.

FIG. 3 shows a processing stage following that of FIG. 2, and specifically shows an opening 50 formed to extend through the stack 15, through the select device gate material 16, and through the insulative material 14 and to the upper surface of conductive material 13. Although the opening 50 is shown extending to the upper surface of conductive material 13, in other embodiments the opening 50 may extend into the conductive material 13.

Opening 50 may be formed utilizing any suitable processing; including, for example, one or more anisotropic etches. The opening 50 may be referred to as a first opening to distinguish it from another opening described later.

The opening 50 comprises a pair of opposing sidewalls 51 in the shown cross-sectional view. The opening 50 may have a continuous outer periphery (i.e., may be a closed shape when viewed from above) so that the illustrated sidewalls 51 are actually part of a single continuous sidewall that wraps entirely around the opening. The opening 50 may have any desired shape, and in some embodiments may correspond to a slit that extends in and out of the page relative to the cross-sectional view of FIG. 3.

The opening 50 may have any suitable dimensions, and in some embodiments may have a width, W, along the illustrated cross-section within a range of from about 700 Å to about 3500 Å.

Although the sidewalls 51 are illustrated to be clean in FIG. 3, in actual practice conductive stringers may be generated during the etching utilized to form the opening. Such conductive stringers may be formed as by-products of the etching process. As such, the conductive stringers may include compositions generated from one or more of the materials etched to form opening 50 and/or may include compositions provided within the etchants utilized to form the opening. Example conductive stringers 52 are diagrammatically illustrated in FIG. 4. The conductive stringers are shown much thicker than they likely occur in order to simplify the drawing. The conductive stringers may be formed on one or both of the opposing sidewalls 51 of opening 50.

A problem with the conductive stringers is that they may short two or more vertically-stacked conductive lines to one another. For instance, each of the illustrated stringers 52 in FIG. 4 is shown electrically shorting two vertically-stacked conductive lines with one another.

Some embodiments include methods of oxidizing the conductive stringers to convert them to insulative oxide and thereby alleviate the conductive shorting otherwise caused by the stringers. The oxidation may comprise any suitable methodology, such as, for example, in situ steam generation (ISSG). If ISSG is used, such may include a process temperature in excess of 700° C.; and may, for example, utilize $O_2$, or a combination of $O_2$ and $H_2$.

Figure 5:
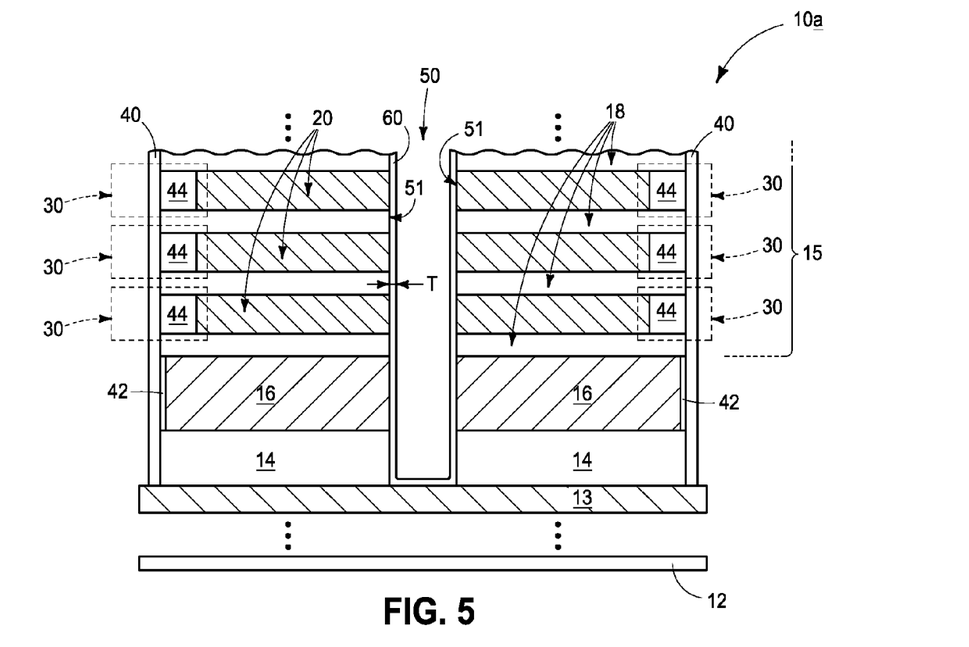
FIG. 5 is a diagrammatic cross-sectional view of the integrated assembly of FIG. 4 shown at a processing stage following that of FIG. 4.
Figure 6:
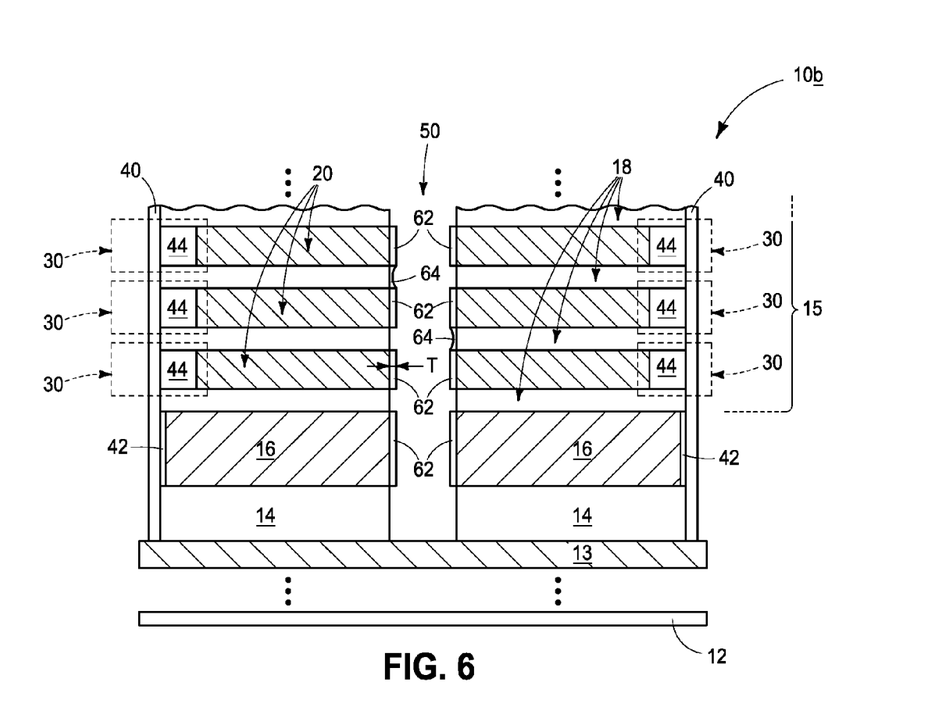
FIGS. 6 and 7 are diagrammatic cross-sectional views of the integrated assembly of FIG. 4 shown at processing stages following that of FIG. 4 and alternative to the processing stage of FIG. 5.
Figure 7:
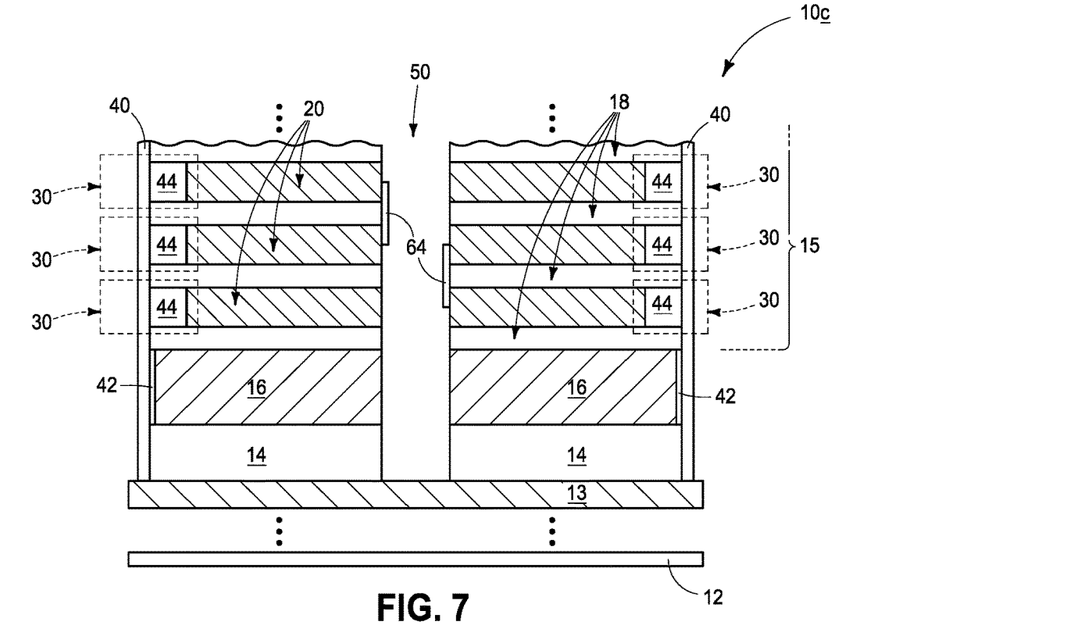

The oxidation of the conductive stringers may form oxide detectable in a finished construction. The configuration of the oxide may vary depending on the conditions utilized for forming the oxide, on the particular materials along the sidewalls 51 of opening 50 and along the bottom of the opening, etc. FIGS. 5-7 illustrate some example configurations of oxide that may be formed during the oxidation of the conductive stringers.

Figure 4:
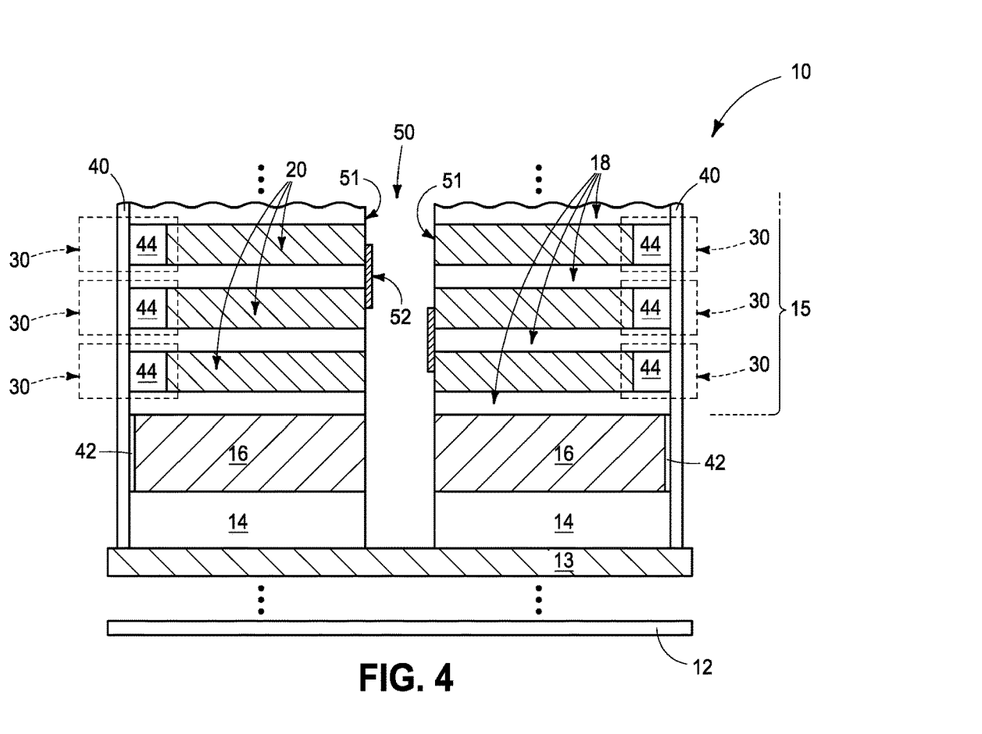

Referring to FIG. 5, a construction 10a is shown at a processing stage subsequent to that of FIG. 4, and specifically after an oxidation process has been utilized to oxidize the conductive stringers 52 (FIG. 4). In the illustrated example of FIG. 5, the oxidation has formed an oxide liner 60 which extends along the sidewalls 51 of opening 50, as well as along the bottom of the opening. In some embodiments the conductive materials 13, 16 and 20 may comprise silicon, and the oxidative conditions utilized to oxidize stringers 52 (FIG. 4) also oxidize exposed surfaces of such conductive materials. The oxidation of the exposed surfaces of the conductive materials 13, 16 and 20 is sufficient to form a silicon dioxide liner 60 entirely along sidewalls 51 in the illustrated embodiment of FIG. 5. Although the illustrated liner has a uniform thickness and composition along the conductive materials 13, 16 and 20, as well as along the insulative materials 14 and 18; in other embodiments the liner may vary in thickness and/or composition along the various materials. For instance, the liner may be substantially thinner along the insulative materials 18 and 14 if the composition of the liner is generated primarily from oxidation along surfaces of conductive materials 13, 16 and 20. Further, the liner may vary in thickness and/or composition along one of the conductive materials 13, 16 and 20 relative to another if the conductive materials have different compositions relative to one another. Further, the oxidized stringers (not shown in FIG. 5) may have different compositions than other regions of the liner.

The liner 60 may have a thickness, T, of from about 10 Å to about 50 Å along surfaces of conductive levels 20 in some embodiments.

Referring to FIG. 6, a construction 10b is shown at a processing stage subsequent to that of FIG. 4, with FIG. 6 showing an alternative embodiment relative to that of FIG. 5. In the illustrated embodiment of FIG. 6 the oxidative conditions form oxide caps 62 along exposed surfaces of conductive levels 20, and form oxide 64 from the conductive stringers 52 (FIG. 4). The oxidation has not formed a substantial thickness of oxide along exposed surfaces of insulative levels 18. The selective formation of oxide along levels 20 relative to levels 18 may occur in embodiments in which, for example, levels 20 comprise polycrystalline silicon and levels 18 comprise silicon dioxide. Notably, the embodiment of FIG. 6 also does not show oxide formed along the exposed upper surface of conductive material 13, but does show oxide formed along exposed surfaces of SGS material 16. Such may occur in embodiments in which conductive material 16 comprises an oxidizable form of silicon, and in which material 13 comprises a conductive material which is not oxidized under the conditions utilized to oxidize the conductive stringers. In other embodiments an upper surface of material 13 may oxidize in addition to surfaces of conductive levels 20 and conductive material 16; and in yet other embodiments exposed surfaces of conductive materials 13 and 16 may not oxidize even though exposed surfaces of conductive levels 20 do oxidize.

In some embodiments the insulative caps 62 may have thicknesses, T, of at least about 5 Å; and in some embodiments may have thicknesses within a range of from about 10 Å to about 50 Å.

Referring to FIG. 7, a construction 10c is shown at a processing stage subsequent to that of FIG. 4, with FIG. 7 showing an alternative embodiment relative to FIGS. 5 and 6. In the illustrated embodiment of FIG. 7 the oxidative conditions form oxide 64 from the conductive stringers 52 (FIG. 4) and do not oxidize other materials exposed within opening 50. The oxide 64 may be quite thin, depending on the thickness and composition of the conductive stringers 52 (FIG. 4). However, the oxide 64 may be detectable; with the term "detectable" meaning that the presence of oxide 64 may be detected through deconstruction and analysis of a component comprising oxide 64 and/or through other methods.

Figure 8:
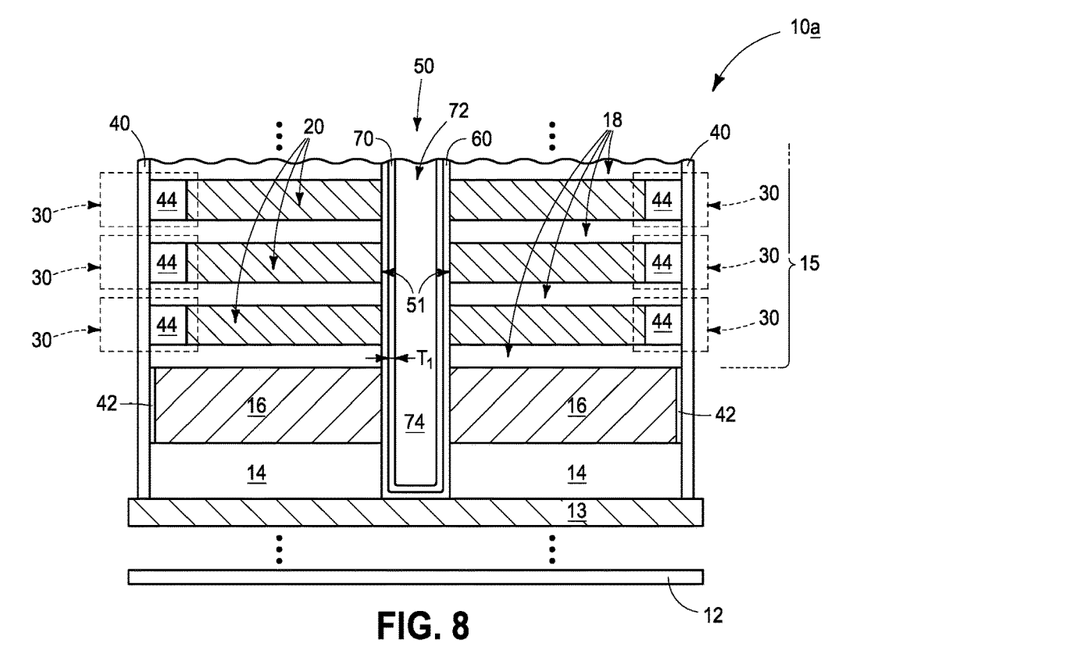
FIGS. 8-10 are diagrammatic cross-sectional views of the integrated assembly of FIG. 4 shown at processing stages following those of FIGS. 5-7, respectively.
Figure 9:
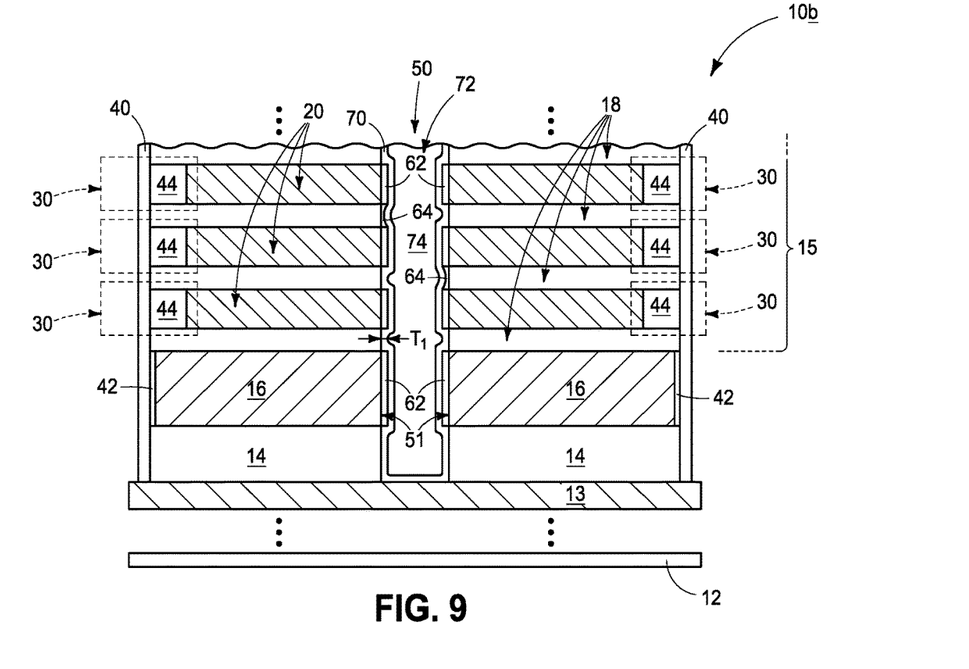
Figure 10:
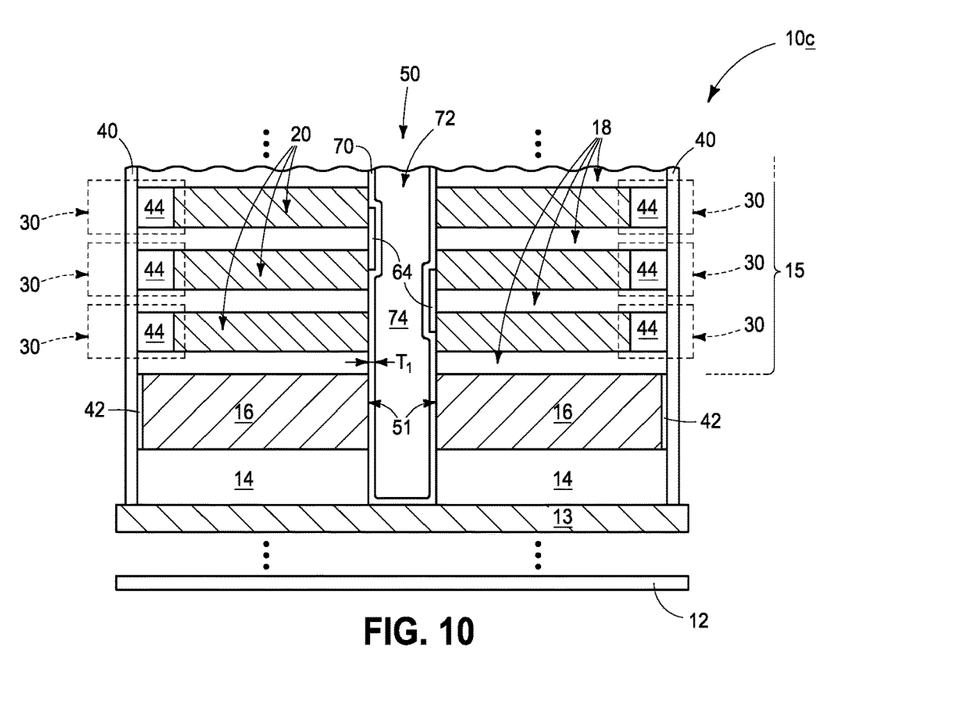

A nitride structure (e.g., liner) may be formed within opening 50. The nitride structure may be beneficial in that it may preclude undesired migration of contaminants into conductive circuit elements 20, 16 and/or 13 (i.e., the nitride structure may function as a barrier). The nitride structure may comprise, consist essentially of, or consist of one or both of silicon oxynitride and silicon nitride. It may be preferable to form a nitride liner within opening 50 as opposed to entirely filling opening 50 with nitride due to costs, performance and/or stress considerations. FIGS. 8-10 show the constructions of FIGS. 5-7, respectively, at processing stages after nitride structures have been formed within the opening 50.

Referring to FIG. 8, construction 10a is shown at a process stage following that of FIG. 5. A nitride structure 70 is formed within opening 50 of construction 10a. The illustrated nitride structure 70 extends along the sidewalls and bottom of opening 50. However, in some embodiments the nitride structure may not extend along the bottom of the opening. Accordingly, the nitride structure 70 may be referred to as including a "pair of liners along the opposing sidewalls 51" in the cross-sectional view of FIG. 8 in order to encompass the illustrated embodiment in which the structure extends along the sidewalls and the bottom of opening 50, as well as embodiments in which the structure is only along the sidewalls of the opening.

The nitride structure may have any suitable thickness, $T_1$, and in some embodiments may have a thickness within a range of from about 50 Å to about 200 Å.

The nitride structure 70 narrows the first opening 50 to form a second opening 72. In the shown embodiment the second opening 72 is filled with insulative material 74. Such insulative material may comprise oxide (for instance, silicon dioxide formed by spin-on methodology, CVD methodology, etc.) and may be referred to as an oxide fill. Although the opening 72 is shown filled with a single homogeneous material 74, in other embodiments the opening may be filled with one or more different materials, and in yet other embodiments at least some of the opening may remain empty (i.e., the opening 72 may not be entirely filled).

The oxide liner 60 of FIG. 8 may be considered to correspond to detectable oxide which is between nitride structure 70 and conductive levels 18. In some embodiments, such detectable oxide may have a thickness of at least about 5 Å or at least about 10 Å; and in some embodiments may have a thickness within a range of from about 10 Å to about 50 Å.

Referring to FIG. 9, construction 10b is shown at a process stage following that of FIG. 6; and specifically a nitride structure 70 is formed within the opening 50 of construction 10b. The illustrated nitride structure is analogous to the nitride structure 70 described above with reference to FIG. 8. The nitride structure may have any suitable thickness, $T_1$, and in some embodiments may have a thickness within a range of from about 50 Å to about 200 Å. The nitride structure 70 narrows the first opening 50 to form a second opening 72. In the shown embodiment, the second opening 72 is filled with insulative material 74. Such insulative material may comprise oxide (for instance, silicon dioxide formed by spin-on methodology, CVD methodology, etc.) and may be referred to as an oxide fill. Although the opening 72 is shown filled with a single homogeneous material 74, in other embodiments the opening may be filled with one or more different materials, and in yet other embodiments at least some of the opening may remain empty (i.e., the opening 72 may not be entirely filled).

The oxide caps 62 of FIG. 9 may be considered to correspond to detectable oxide which is between nitride structure 70 and conductive levels 18. In some embodiments, such detectable oxide may have a thickness of at least about 5 Å or at least about 10 Å; and in some embodiments may have a thickness within a range of from about 10 Å to about 50 Å.

Referring to FIG. 10, construction 10c is shown at a process stage following that of FIG. 7; and specifically after a nitride structure 70 is formed within opening 50 of construction 10c. The illustrated nitride structure is analogous to the nitride structure 70 described above with reference to FIG. 8. The nitride structure may have any suitable thickness, $T_1$, and in some embodiments may have a thickness within a range of from about 50 Å to about 200 Å. The nitride structure 70 narrows the first opening 50 to form a second opening 72. In the shown embodiment, the second opening 72 is filled with insulative material 74. Such insulative material may comprise oxide (for instance, silicon dioxide formed by spin-on methodology, CVD methodology, etc.) and may be referred to as an oxide fill. Although the opening 72 is shown filled with a single homogeneous material 74, in other embodiments the opening may be filled with one or more different materials, and in yet other embodiments at least some of the opening may remain empty (i.e., the opening 72 may not be entirely filled).

In some embodiments the oxidized stringer material 64 of FIG. 10 may be considered to correspond to detectable oxide which is between nitride structure 70 and conductive levels 18. Presence of such detectable oxide may be ascertained by deconstruction and analysis of a component comprising material 64 and/or by other methods.

Figure 11:
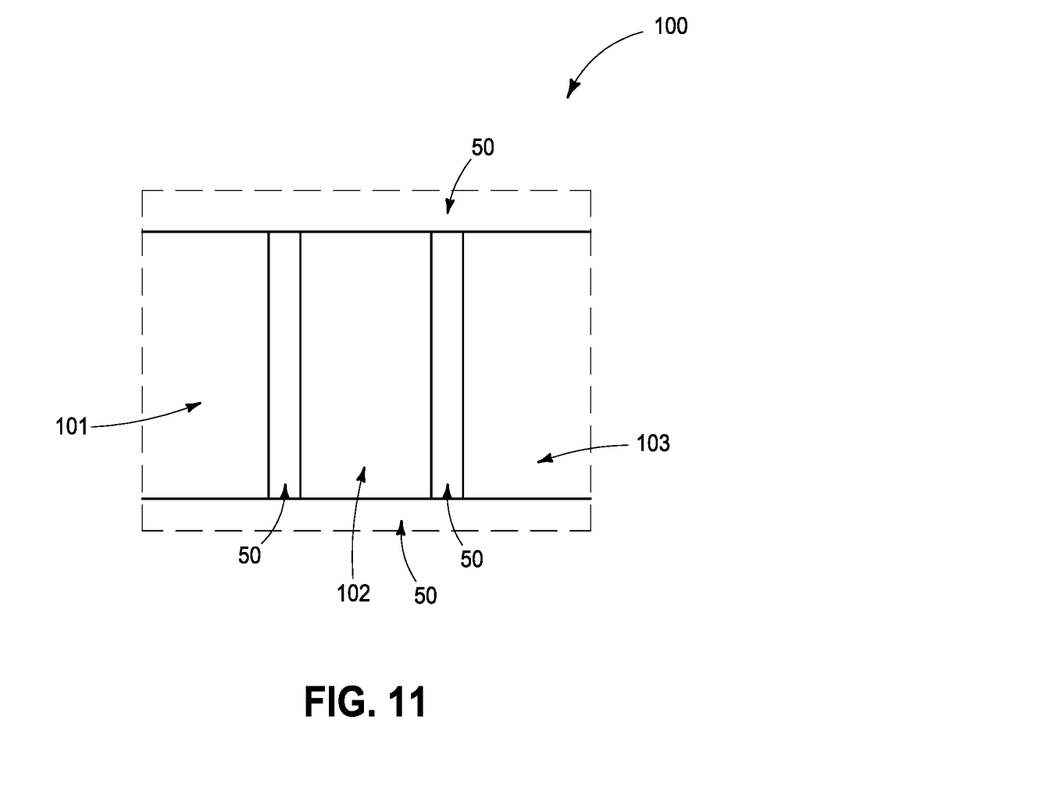
FIG. 11 is a diagrammatic top view of an integrated circuit die showing a memory structure subdivided into blocks.

In some embodiments opening 50 of FIGS. 8-10 is a slit utilized to physically define blocks within an integrated memory structure. FIG. 11 is a top view of an integrated memory structure 100. Such memory structure may comprise, for example, NAND. A plurality of slits 50 extend throughout the memory structure to physically subdivide the memory structure into blocks 101-103 (the slits 50 may be filled with the various materials 60, 62, 64, 70 and 74 described above with reference to FIGS. 8-10). In some embodiments each block may correspond to a smallest unit within the memory structure which may be erased, and each block may contain a number of pages which correspond to the smallest units which may be programmed.

Although various embodiments are described above with reference to NAND architectures, it is to be understood that aspects of the invention(s) described herein may extend to architectures other than NAND. Such other architectures may include memory architectures, logic architectures, etc.

The structures described herein may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include an integrated structure comprising a stack. The stack comprises alternating insulative levels and conductive levels. A first opening extends through the stack. A nitride structure is within the first opening and narrows the first opening to form a second opening. Detectable oxide is between the nitride structure and one or more of the conductive levels.

Some embodiments include an integrated structure comprising a conductive material. A select device gate material is over the conductive material and spaced from the conductive material by an insulative material. Vertically-stacked conductive levels are over the select device gate material. A first opening extends through the vertically-stacked levels to the conductive material and has opposing sidewalls along a cross-section. Nitride liners are along the opposing sidewalls of the first opening, and narrow the first opening to form a second opening. Detectable oxide is between at least one of the nitride liners and one or more of the vertically-stacked conductive levels.

Some embodiments include a method of forming an integrated structure. An assembly is formed to comprise a conductive material, a select device gate material over the conductive material and spaced from the conductive material by an insulative material, and a stack over the select device gate material and comprising alternating insulative levels and conductive levels. A first opening is formed to extend through the stack, through the select device gate material, through the insulative material and to the conductive material. The first opening has opposing sidewalls along a cross-section. The formation of the first opening generates conductive stringers along one or both of the sidewalls of the first opening. The conductive stringers are oxidized to convert them to insulative oxide. Nitride liners are formed along the sidewalls of the first opening and over the insulative oxide. The nitride liners narrow the first opening to form a second opening.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated structure, comprising:
   forming an assembly comprising a conductive material, a select device gate material over the conductive material and spaced from the conductive material by an insulative material, and a stack over the select device gate material and comprising alternating insulative levels and conductive levels;
   forming a first opening to extend through the stack, through the select device gate material, through the insulative material and to the conductive material; the first opening having opposing sidewalls along a cross-section; the formation of the first opening generating conductive stringers along one or both of the opposing sidewalls of the first opening;
   oxidizing the conductive stringers to convert them to insulative oxide; and
   forming nitride liners along the opposing sidewalls of the first opening and over the insulative oxide, the nitride liners narrowing the first opening to form a second opening.

2. The method of claim 1 wherein the oxidation of the conductive stringers utilizes in situ steam generation.

3. The method of claim 2 wherein the in situ steam generation utilizes $O_2$ and a temperature in excess of 700° C.

4. The method of claim 2 wherein the in situ steam generation utilizes $H_2$, $O_2$ and a temperature in excess of 700° C.

5. The method of claim 2 comprising filling the second opening with one or more insulative compositions.

6. The method of claim 2 comprising filling the second opening with silicon dioxide.

* * * * *